United States Patent
Bao et al.

(10) Patent No.: US 9,202,743 B2
(45) Date of Patent: Dec. 1, 2015

(54) GRAPHENE AND METAL INTERCONNECTS

(71) Applicant: International Business Machines Corporation, Armonk, NY (US)

(72) Inventors: Junjing Bao, Cedar Grove, NJ (US); Griselda Bonilla, Fishkill, NY (US); Samuel S. Choi, Beacon, NY (US); Ronald G. Filippi, Wappingers Falls, NY (US); Naftali E. Lustig, Croton on Hudson, NY (US); Andrew H. Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/716,636

(22) Filed: Dec. 17, 2012

(65) Prior Publication Data

US 2014/0167268 A1    Jun. 19, 2014

(51) Int. Cl.
*H01L 21/768* (2006.01)
*H01L 23/48* (2006.01)
*H01L 23/532* (2006.01)

(52) U.S. Cl.
CPC .... *H01L 21/76805* (2013.01); *H01L 21/76879* (2013.01); *H01L 23/53276* (2013.01); *H01L 21/76865* (2013.01); *H01L 2924/0002* (2013.01)

(58) Field of Classification Search
CPC ............... H01L 29/1606; H01L 21/76805; H01L 21/76807; H01L 23/53276; H01L 21/76879; H01L 21/76865
USPC .......................................... 438/652; 257/774
See application file for complete search history.

(56) References Cited

U.S. PATENT DOCUMENTS

| | | |
|---|---|---|
| 5,470,788 A | 11/1995 | Biery et al. |
| 6,597,067 B1 | 7/2003 | Biery et al. |
| 7,259,463 B2 | 8/2007 | Huang et al. |

(Continued)

FOREIGN PATENT DOCUMENTS

| | | |
|---|---|---|
| CN | 102593098 A | 7/2012 |
| JP | 2009267371 A | 11/2009 |

(Continued)

OTHER PUBLICATIONS

Chen et al., "Intrinsic and extrinsic performance limits of graphene devices on SiO2"; Published online Mar. 23, 2008; doi; 10.1038/nnano.2008.58; Copyright 2008 Nature Publishing Group.

(Continued)

*Primary Examiner* — Latanya N. Crawford
(74) *Attorney, Agent, or Firm* — Isaac J. Gooshaw

(57) ABSTRACT

A graphene and metal interconnect structure and methods of making the same are disclosed. The graphene is a multiple layer graphene structure that is grown using a graphene catalyst. The graphene forms an electrical connection between two or more VIAs or components, or a combination of VIAs and components. A VIA includes a fill metal, with at least a portion of the fill metal being surrounded by a barrier metal. A component may be a routing track, a clock signal source, a power source, an electromagnetic signal source, a ground terminal, a transistor, a macrocell, or a combination thereof. The graphene is grown, using a graphene catalyst, from both solid and liquid carbon sources using chemical vapor deposition (CVD) at a temperature between 300° C.-400° C. The graphene catalyst can be an elemental form of, or alloy including, nickel, palladium, ruthenium, iridium or copper.

18 Claims, 4 Drawing Sheets

(56) References Cited

U.S. PATENT DOCUMENTS

| | | | |
|---|---|---|---|
| 7,492,046 | B2 | 2/2009 | Furukawa et al. |
| 7,572,682 | B2 | 8/2009 | Yang et al. |
| 7,598,127 | B2 | 10/2009 | Whitefield et al. |
| 7,745,810 | B2 | 6/2010 | Rueckes et al. |
| 7,787,292 | B2 | 8/2010 | Keshavarzi et al. |
| 8,101,529 | B2 | 1/2012 | Narita |
| 8,237,142 | B2 | 8/2012 | Cheung et al. |
| 8,463,090 | B2 | 6/2013 | Donval et al. |
| 8,482,126 | B2 * | 7/2013 | Wada et al. ............ 257/750 |
| 8,647,978 | B1 | 2/2014 | Ott et al. |
| 8,735,242 | B2 | 5/2014 | Zhu |
| 2004/0217481 | A1 | 11/2004 | Farrar |
| 2007/0023914 | A1 | 2/2007 | Farrar |
| 2007/0176255 | A1 | 8/2007 | Kreupl et al. |
| 2008/0296728 | A1 | 12/2008 | Yang et al. |
| 2010/0021708 | A1 | 1/2010 | Kong et al. |
| 2011/0006425 | A1 | 1/2011 | Wada et al. |
| 2011/0059599 | A1 | 3/2011 | Ward et al. |
| 2011/0091647 | A1 | 4/2011 | Colombo et al. |
| 2011/0101528 | A1 | 5/2011 | Akimoto et al. |
| 2011/0115094 | A1 | 5/2011 | Darnon et al. |
| 2011/0254082 | A1 * | 10/2011 | Jang ............... 257/330 |
| 2012/0006580 | A1 * | 1/2012 | Sandhu ............ 174/126.1 |
| 2012/0080661 | A1 * | 4/2012 | Saito et al. ............ 257/29 |
| 2012/0080662 | A1 * | 4/2012 | Saito et al. ............ 257/29 |
| 2012/0080796 | A1 * | 4/2012 | Wada et al. ............ 257/762 |
| 2012/0139114 | A1 | 6/2012 | Zhang et al. |
| 2012/0205626 | A1 | 8/2012 | Dimitrakopoulos et al. |
| 2013/0015581 | A1 | 1/2013 | Wann et al. |
| 2013/0056873 | A1 * | 3/2013 | Wada et al. ............ 257/746 |
| 2013/0113102 | A1 | 5/2013 | Bao et al. |
| 2013/0203222 | A1 | 8/2013 | Chung et al. |
| 2013/0217226 | A1 * | 8/2013 | Kitamura et al. ............ 438/652 |
| 2014/0070425 | A1 | 3/2014 | Wada et al. |
| 2014/0138829 | A1 | 5/2014 | Zhao et al. |

FOREIGN PATENT DOCUMENTS

| | | |
|---|---|---|
| KR | 20070097764 A | 10/2007 |
| WO | 2014099428 A1 | 6/2014 |

OTHER PUBLICATIONS

Li et al., "Graphene Films with Large Domain Size by a Two-Step Chemical Vapor Deposition Process"; Received for review: May 7, 2010; Published on Web: Oct. 19, 2010, Copyright 2010 American Chemical Society; DOI: 10.1021/nl101629g | Nano Lett. 2010, 10, pp. 4328-4334.

Li et al., "Low-Temperature Growth of Graphene by Chemical Vapor Deposition Using Solid and Liquid Carbon Sources"; vol. 5; No. 4; pp. 3385-3390; 2011, Received for review Mar. 4, 2011 and accepted Mar. 25, 2011, Published online Mar. 25, 2011 10.1021/nn200854p, Copyright American Chemical Society.

Mattevi et al., "A review of chemical vapour deposition of graphene on copper"; Received Jul. 5, 2010, Accepted Oct. 4, 2010, DOI: 10.1039/c0jm02126a; Journal of Materials Chemistry; J. Mater. Chem., 2011, 21; pp. 3324-3334; Copyright The Royal Society of Chemistry 2011.

Murali et al., "Breakdown current density of graphene nanoribbons"; Received Apr. 21, 2009; accepted May 1, 2009; published online Jun. 19, 2009; Copyright 2009 American Institute of Physics; DOI: 10.1063/1.3147183; Downloaded Sep. 9, 2011 to 129.34.20.23. Redistribution subject to AIP license or copyright; see <http://apl.aip.org/about/rights_and_permissions>.

Pollard. "Growing Graphene via Chemical Vapor Deposition"; Department of Physics, Pomona College; May 2, 2011; pp. 1-47.

Sutter et al., "Graphene growth on epitaxial Ru thin films on sapphire"; Received Oct. 6, 2010; accepted Oct. 29, 2010; published online Nov. 23, 2010; doi:10.1063/1.3518490; Copyright 2010 American Institute of Physics.

Xia., "The origins and limits of metal-graphene junction resistance"; Published Online: Feb. 6, 2011; DOI: 10.1038/NNANO.2011.6; Nature Nanotechnology vol. 6 Mar. 2011; <www.nature.com/naturenanotechnology>; Copyright 2011 Macmillan Publishers Limited.

Lcyarris.; "Graphene Films Clear Major Fabrication Hurdle"; <http://newscenter.lbl.gov/feature-stories/2010/04/08/graphene-films/print/>; Copyright © 2008 Berkeley Lab News Center; Apr. 8, 2010; printed Nov. 5, 2012.

"New Graphene Fabrication Method Uses Silicon Carbide Templates to Create Desired Growth"; < http://www.sciencedaily.com/releases/2010/10/101005121724.htm>; ScienceDaily (Oct. 6, 2010).

U.S. Appl. No. 13/551,962; entitled; "Use of Graphene to Limit Copper Surface Oxidation, Diffusion and Electromigration in Interconnect Structures"; Filed Jul. 18, 2012.

"Patent Cooperation Treaty International Search Report" Applicant International Business Machines Corporation, File Reference FIS920120244, PCT/US2013/073773, filed Dec. 9, 2013.

Pending U.S. Appl. No. 13/873,356, entitled "Hybrid Graphene-Metal Interconnect Structures", filed on Apr. 30, 2013.

Yu et al., "Bilayer Graphene/Copper Hybrid On-Chip Interconnect: A Reliability Study", IEEE Transactions on Nanotechnology, vol. 10, No. 4, Jul. 2011, pp. 710-714.

Yarris, "Graphene Films Clear Major Fabrication Hurdle", Apr. 8, 2010, News Center, http://newscenter.lbl.gov/2010/04/08/graphene-films/, Accessed on Aug. 1, 2014, pp. 1-5.

Robertson et al., "Use of carbon nanotubes for VLSI interconnects", Diamond & Related Materials vol. 18, 2009, pp. 957-962.

Pending U.S. Appl. No. 14/454,765, entitled: "Graphene-Metal E-Fuse", filed on Aug. 8, 2014.

* cited by examiner

GRAPHENE AND METAL INTERCONNECTS

FIELD OF THE INVENTION

The present invention relates generally to the field of semiconductor structure and a method of forming the same, and more particularly to a back-end-of-the line (BEOL) interconnect structure primarily composed of graphene and metal.

BACKGROUND OF THE INVENTION

Integrated circuit(s) typically include a plurality of semiconductor devices and interconnect wiring. Networks of metal interconnect wiring typically connect the semiconductor devices from a semiconductor portion of a semiconductor substrate. Multiple levels of metal interconnect wiring above the semiconductor portion of the semiconductor substrate are connected together to form a back-end-of-the line (BEOL) interconnect structure. Within such a structure, metal lines run parallel to the substrate and metal vias run perpendicular top the substrate.

Two developments in the last decade have contributed to increased performance of contemporary ICs. One such development is the use of copper as the interconnect metal of the BEOL interconnect structure. Copper is advantageous because it has a higher conductivity compared with other traditionally used interconnect metals such as, for example, aluminum. However, when compared to copper, other materials such as graphene have superior current carrying capacities and thermal conductivity, but many methods of producing graphene have presented numerous challenges which discouraged the inclusion of graphene in contemporary ICs.

SUMMARY

The present invention provides a single damascene or dual damascene graphene and copper interconnect structure, and method for making the same. The graphene portion of the interconnect structure is a multiple layer graphene structure that is grown using a graphene catalyst. The multiple layers of graphene form an electrical connection between two or more elements. The elements may be VIAs or components, or a combination of VIAs and components. A VIA includes a fill metal, with at least a portion of the fill metal being surrounded by a barrier metal. A component may be a routing track, a clock signal source, a power source, an electromagnetic signal source, a ground terminal, a transistor, and a macrocell. The multiple layers of graphene are grown, using a graphene catalyst, from both solid and liquid carbon sources using chemical vapor deposition (CVD) at a temperature between 300° C.-400° C.

Broadly, the method to create the graphene and copper interconnect structure includes etching a first trench, thereby removing at least a portion of a top end of a first via, such that the first end of the first trench intersects the top portion of the first via. A layer of tantalum nitride is deposited into the first trench. A layer of graphene catalyst is deposited into the first trench. the first trench is defined by applying chemical-mechanical planarization. Multiple layers of graphene are grown in the first trench. A layer of dielectric material is deposited to form a cap over the first trench and first via.

An exemplary embodiment also provides an interconnect structure made from the above mentioned broad method that further includes applying a layer of substrate on top of the cap. A second trench is etched such that the second trench intersects and removes at least a portion of the second end of the graphene filled first trench. A layer of barrier material is deposited into the second trench. The second trench is filled with fill metal to form a second via.

An exemplary embodiment also provides an interconnect structure made from the above mentioned broad method that further includes applying a layer of substrate on top of the cap. A second trench is etched such that the second trench contacts at least a portion of the second end of the graphene filled first trench. A layer of barrier material is deposited into the second trench. The second trench is filled with fill metal to form a second via.

An exemplary embodiment also provides an interconnect structure made from the above mentioned methods that further includes forming an electrical connection between a given VIA, included in the interconnect structure, and a component.

BRIEF DESCRIPTION OF THE SEVERAL VIEWS OF THE DRAWINGS

In the drawings, wherein like reference characters denote similar elements throughout the several views.

DETAILED DESCRIPTION

Figure 1:
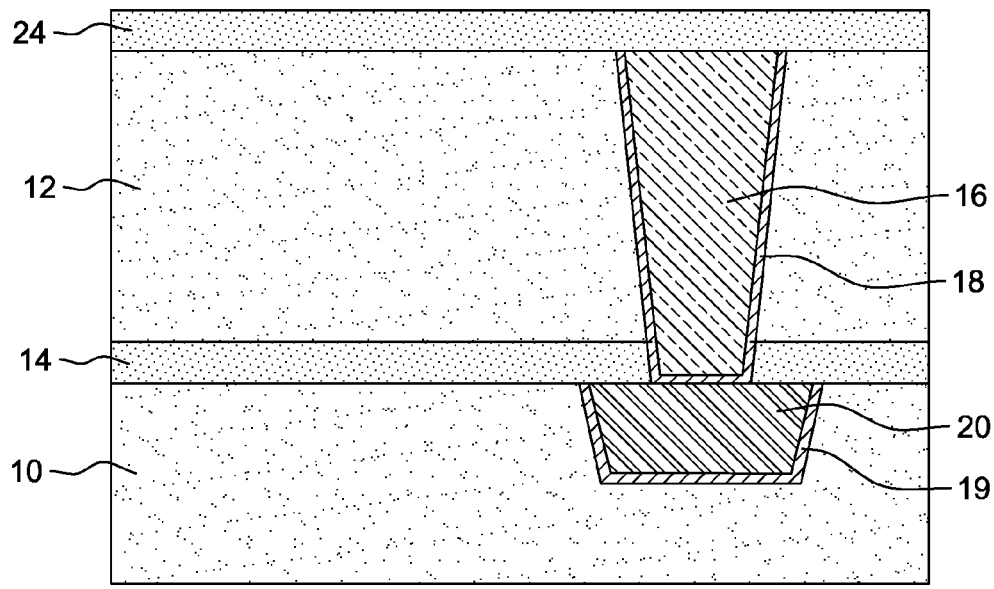
FIG. 1 is a side elevated view of the starting graphene and metal interconnect structure including a component and via fabricated using the damascene method, in accordance with an exemplary embodiment of the invention.

In the fabrication/manufacture of integrated circuit chips, there is a growing desire to fit more devices and circuits within each chip along with higher levels of energy efficiency. As such, there is a constant need to not only reduce the size of the circuit components, but also to reduce the size and resistance of wiring and connecting vias interconnected to the circuit components and the spacing (pitch) between one VIA (and connecting wire) to another VIA (and connecting wire) on the same level. These wires and VIAs may be disposed of in one or more metallization layers formed on top of a semiconductor substrate.

The semiconductor substrate is preferably, but not necessarily, made up of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate may also be made up of other semiconductor materials, such as germanium, and compound semiconductor substrates, such as type III/V semiconductor substrates, e.g., GaAs. Although the semiconductor substrate is often depicted as a bulk semiconductor substrate, semiconductor on insulator (SOI) substrate arrangements, such as silicon on insulator substrates, are also suitable substrates for use in an integrated circuit chip.

The substrate may include one or more circuit components or devices, such as transistors, capacitors, or resistors formed thereon. In other exemplary embodiments, other types of circuit components or devices may be used.

A metallization layer is wiring (conductive lines) embedded in a dielectric material. Multiple metallization layers are often put together and interconnected through conventional vias, which pass through the dielectric material to contact metal wires on separate levels. A metallization layer may also be referred to herein as a metal layer, a wiring layer, or a wiring level. The vias, metal layer, the wiring layer, or wiring level together may be called the interconnect structure or the Back End of Line (BEOL) wiring levels.

A dielectric layer may include both an upper portion, i.e., the dielectric material in which wiring is formed, and a lower portion, i.e., the dielectric material in which conductive vias are formed. The lower portion serves as an inter-level dielectric (ILD) layer while the upper portion serves as an intrametal dielectric (IMD) layer. The dielectric layer can be a single layer or a multi-layered stack. For example, a single layer can be used to serve as both the ILD and IMD or separate layers are used for the ILD and IMD. In another example, an etch stop layer (a layer of material typically placed underneath the material to be etched to stop the etching process) can be disposed between the ILD and IMD.

The conductive material used to create the wiring (conductive lines) may be a metal, such as tungsten, copper, aluminum, respective alloys, or combinations thereof. Conductive vias may be made up of the same or different materials from the wiring. Vias may connect the conductive line to contact regions below. Depending on the dielectric layer level, the contact region can be another conductive line in a lower dielectric layer or the contact region can be a device, such as a diffusion region, a gate of a transistor, or a plate of a capacitor.

Wiring and vias are typically made using photo lithography processing. In conventional photo lithography processing, a photo resistant masking material (photoresist) is disposed over one or more layers of a dielectric material. A masking step is performed to selectively remove photo resist material from certain regions (i.e., via hole locations and wiring paths) of the dielectric material, which are left exposed. An etch process follows, which etches away the exposed portions of the dielectric material forming trenches and via holes therein. A metal deposition process fills these portions with conductive material to form the wiring and vias of a layer.

More specifically, the masking step performed involves focusing light, through a mask image, onto the surface of the photo resist layer. Due to focusing and light wavelength constraints, there is a limitation on how small an image can be formed.

To create wiring and vias with smaller critical dimensions (CD), less than 40 nm for example, and tighter pitches, less than 80 nm for example, the mask images must be created on a sub-lithographic scale (i.e., of a size smaller than can be produced using conventional lithographic processes). In addition, smaller CD and tighter grouping allow for little error in forming the vias and connecting wires. As such, it is desirable to have a process where vias self-align themselves to their respective metal lines during their creation.

Initially, aluminum was the metal of choice for many methods used for the fabrication/manufacture of integrated circuit chips. However, aluminum has higher electrical resistance than silver or copper, which have nearly half of the resistance of aluminum. The cost and ease of use made copper a better choice for fabrication/manufacture of integrated circuit chips. Unfortunately, copper introduced a number of new challenges. Because of the lack of volatile copper compounds, copper could not be patterned by the techniques of photoresist masking and plasma etching that had been used with great success with aluminium. The inability to plasma etch copper called for a drastic rethinking of the metal patterning process and the result of this rethinking was a process referred to as an additive patterning or a "Damascene" or "dual-Damascene" process.

In this process, the underlying silicon oxide insulating layer is patterned with open trenches where the conductor is located. A thick coating of copper that significantly overfills the trenches is deposited on the insulator, and chemical-mechanical planarization (CMP; also called chemical-mechanical polishing) is used to remove the copper to the level of the top of the insulating layer. Copper sunken within the trenches of the insulating layer is not removed and becomes the patterned conductor. With multiple applications of this process a number of layers can be built up to form complex structures.

Figure 6:
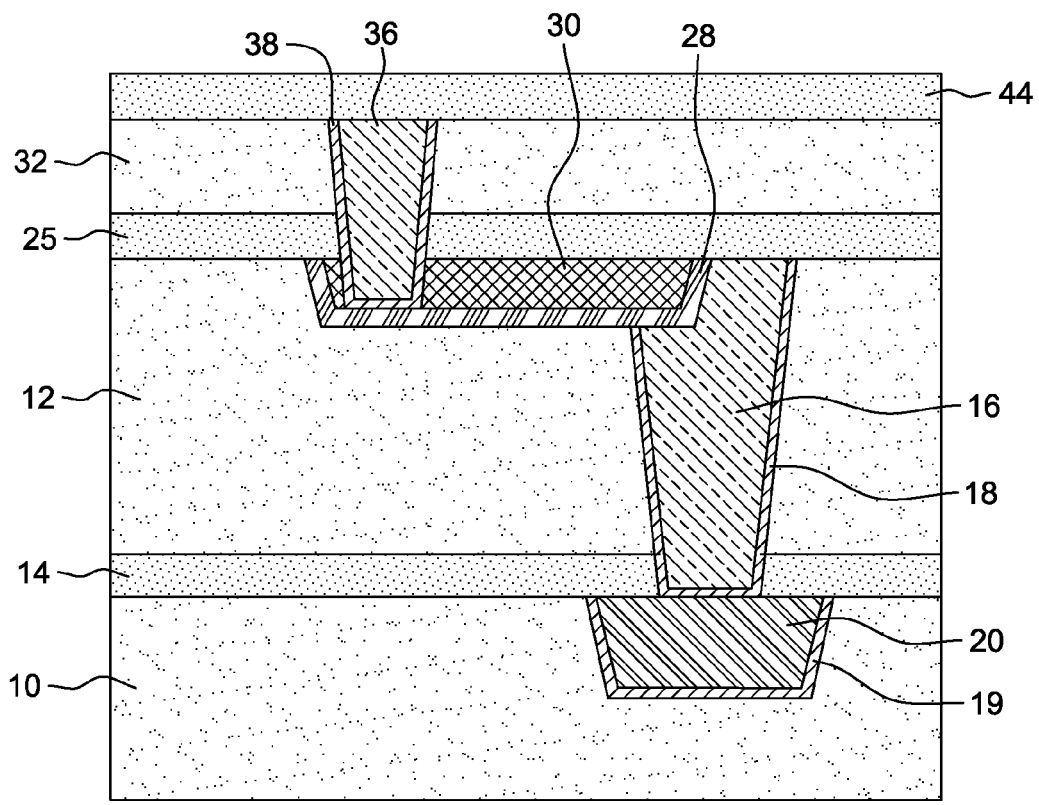
FIG. 6 is a side elevated view illustrating a completed graphene and metal interconnect structure, in accordance with an exemplary embodiment of the invention.
Figure 7:
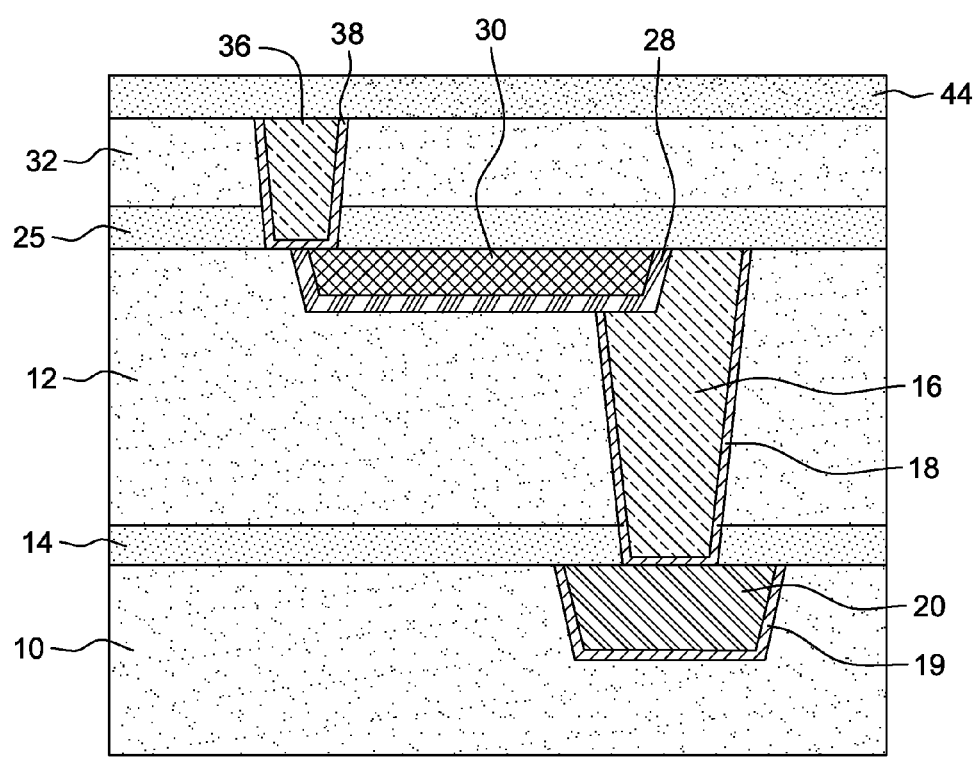
FIG. 7 is a side elevated view illustrating a completed graphene and metal interconnect structure, in accordance with an exemplary embodiment of the invention.

Referring to FIG. 1, in accordance with an exemplary embodiment, there is illustrated a substrate 10, 12 that is employed in one embodiment of the present invention. Similarly, layer 32 depicted in FIGS. 6 and 7 illustrates a substrate. Substrates 10, 12, and 32 may comprise a semiconductor material, an insulator material, a conductive material, or any combination thereof including multilayers. When substrates 10, 12, and 32 are comprised of a semiconductor material, any semiconductor such as, for example, Si, SiGe, SiGeC, SiC, Ge alloys, GaAs, InAs, InP and other III/V or II/VI compound semiconductors may be used. In addition to these listed types of semiconducting materials, substrate 10,12, and 32 can also be a layered semiconductor substrate such as, for example, Si/SiGe, Si/SiC, silicon-on-insulators (SOIs) or silicon germanium-on-insulators (SGOIs).

In accordance with an exemplary embodiment, when substrate 10, 12, and 32 comprises a semiconductor material, one or more semiconductor devices such as, for example, complementary metal oxide semiconductor (CMOS) devices can be fabricated thereon.

In accordance with an exemplary embodiment, when substrate 10, 12, and 32 is an insulator material, the insulator material can be an organic insulator, an inorganic insulator or a combination thereof including multilayers. When substrate 10,12, and 32 is a conductive material, substrate 10,12, and 32 may include, for example, polySi, an elemental metal, alloys of elemental metals, a metal silicide, a metal nitride or combinations thereof including multilayers. When substrate 10, 12, and 32 comprises a combination of an insulator material and a conductive material, substrate 10, 12, and 32 may represent a first interconnect level of a multilayered interconnect structure.

As depicted in FIG. 1, in accordance with an exemplary embodiment, layers 14 and 24 are etch stop (or etching retardant) layers that can be employed in one embodiment of the present disclosure. Similarly, layers 25 and 44 depicted in FIGS. 6 and 7 illustrate etch stop layers. In this disclosure the etch stop layers are composed of silicon carbon nitride (SiCN), a copper passivation and etch stop material. In general, a layer of "etch stop" material is typically placed underneath the material to be etched to stop the etching process. Each of etch stopping layers 14, 24, 25 and 44 can be composed of material, known in the art, which feature different etch characteristics than the material to be etched (e.g., substrate 12).

In this exemplary embodiment, substrate 10 includes a component 20. In general, component 20 is a structure that requires routing or connection to an interconnect. Component 20 is, in this embodiment, a macrocell connected to the bottom of a vertical interconnect access (VIA) 16. VIA 16 is composed of a copper core surrounded on three sides by a barrier metal 18. In this example, component 20 is also surrounded by a barrier metal (19). In another example depicted in FIGS. 6 and 7, VIA 36 is composed of a copper core and is surrounded by a barrier metal 38 on three sides. In this embodiment, VIA 16 and VIA 36 are structures that form an electrical connection capable of carrying a signal between two or more layers (e.g., substrates 10 and 12). In other embodiments, the core of a VIA can be filled with elemental forms or alloys including copper, aluminum, silver, gold, calcium, platinum, tin, lithium, zinc, nickel, and tungsten.

In this exemplary embodiment, barrier metal 18, 19, and 38 are materials used in integrated circuits to chemically isolate semiconductors from soft metal interconnects, while maintaining an electrical connection between them. For instance, a layer of barrier metal must surround every copper interconnection in modern copper-based chips, to prevent diffusion of copper into surrounding materials, since diffusion of copper into surrounding materials can degrade their properties. Some materials that have been used as barrier metals include cobalt, ruthenium, tantalum, tantalum nitride, indium oxide, tungsten nitride, and titanium nitride (the last four being conductive ceramics, but "metals" in this context).

Figure 2:
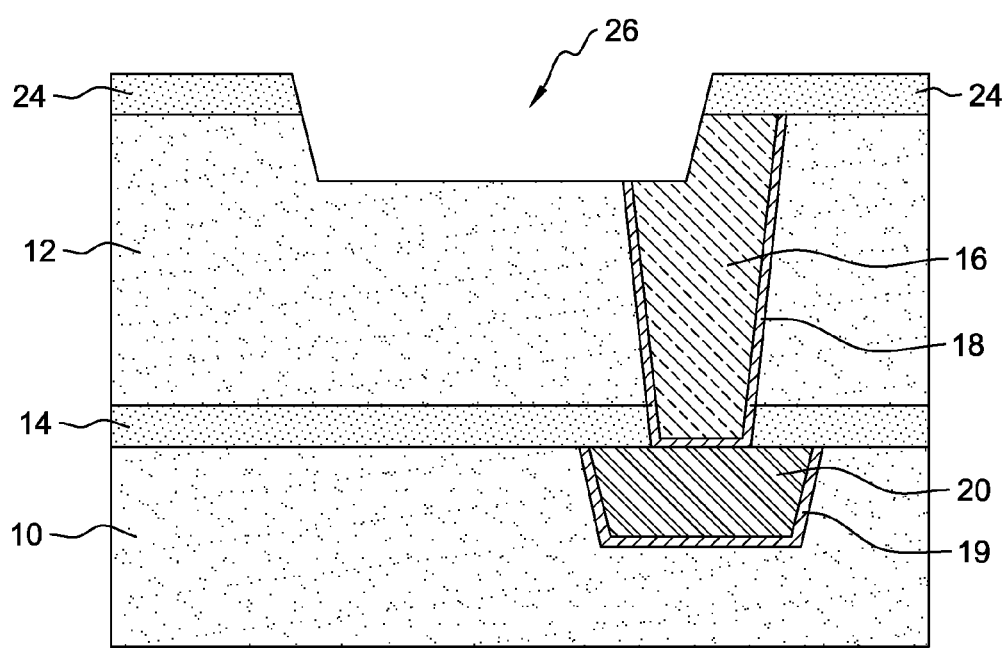
FIG. 2 is a side elevated view illustrating the creation of a trench wherein the graphene and metal interconnect structure is to be defined, in accordance with an exemplary embodiment of the invention.

Referring now to FIG. 2, in accordance with an exemplary embodiment, a trench 26 is etched (e.g., using lithography) through etch stop layer 24 and into substrate layer 12. The right end of trench 26 intersects VIA 16 and barrier metal 18 such that a portion of VIA 16 and barrier metal 18 have been removed, thereby exposing copper core of VIA 16.

Figure 3:
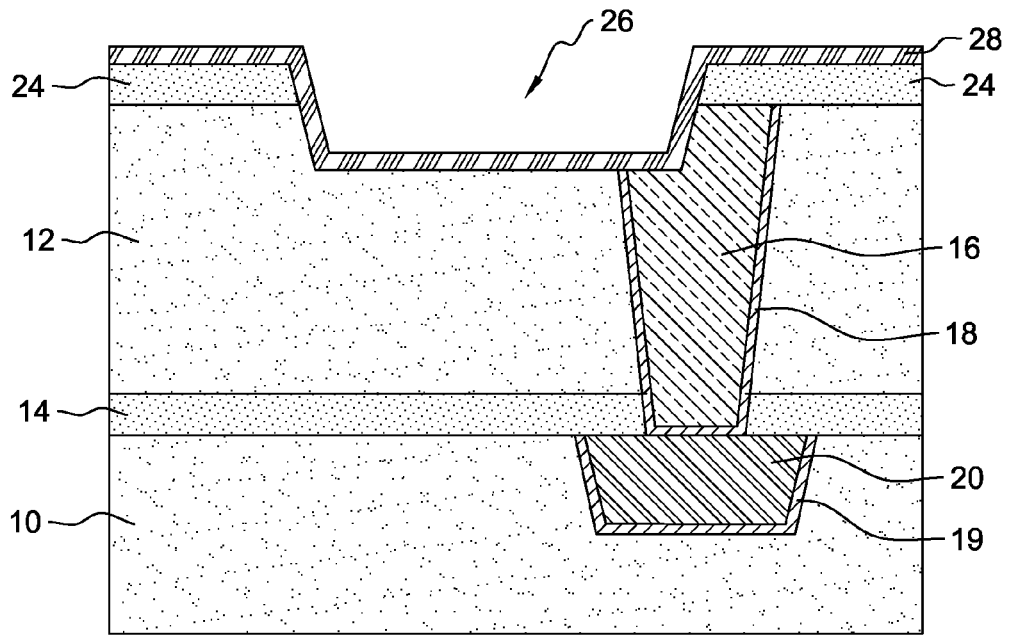
FIG. 3 is a side elevated view illustrating deposited layers of tantalum nitride (TaN) and Ruthenium(Ru) on the graphene and metal interconnect structure, in accordance with an exemplary embodiment of the invention.
Figure 4:
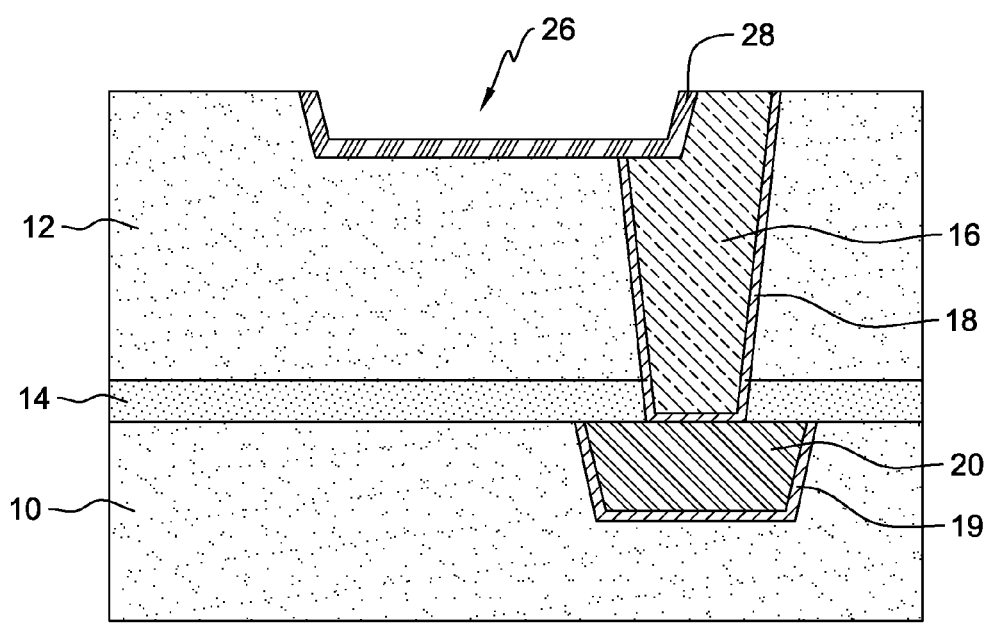
FIG. 4 is a side elevated view illustrating a further defined trench, of the graphene and metal interconnect structure, created using chemical-mechanical planarization (CMP) in accordance with an exemplary embodiment of the invention.

Referring now to FIG. 3, in accordance with an exemplary embodiment, a tantalum nitride (TaN) layer has been applied followed by a layer of ruthenium (Ru), and both layers combined compose liner layer 28. The tantalum nitride (TaN) layer facilitates the adherence of the ruthenium to substrate 12. Ruthenium, in this exemplary embodiment, is a graphene catalyst, i.e., a catalyst that aids in the growth of graphene in trench 26 (see below). In other embodiments other elements or materials, including alloys, can be substituted for the ruthenium catalyst such as nickel, palladium, iridium, and copper. After liner layer 28 is deposited, excess and/or unwanted material is removed by the process of CMP. In an example, as depicted in FIG. 4, etch stop layer 24 and a portion of liner layer 28 are removed by the process of CMP.

Figure 5:
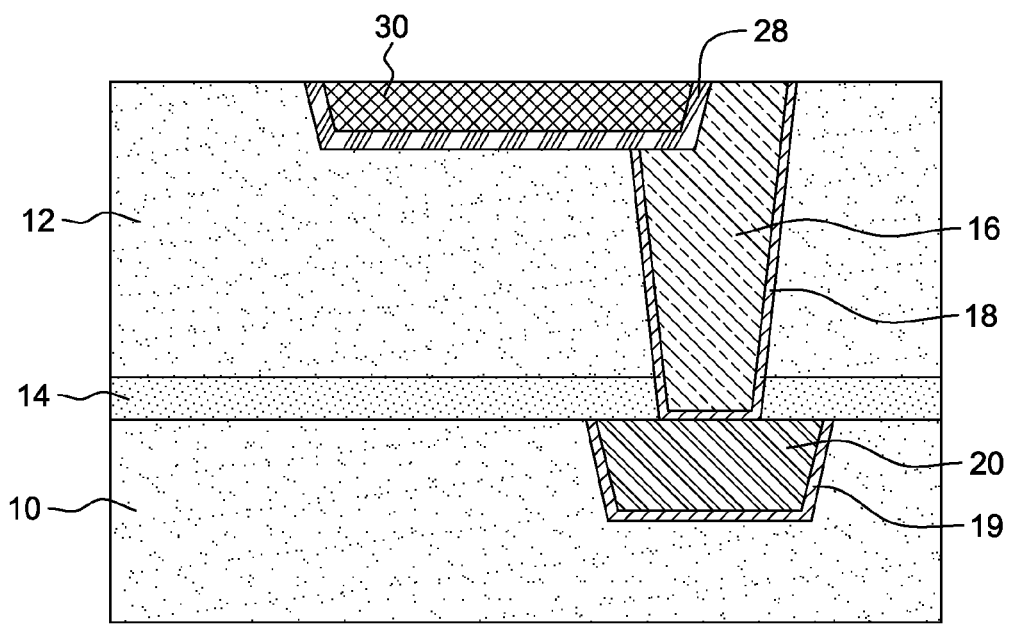
FIG. 5 is a side elevated view illustrating the trench, of the graphene and metal interconnect structure, filled with graphene selectively grown using chemical vapor deposition (CVD), in accordance with an exemplary embodiment of the invention.

Referring now to FIG. 5, in accordance with an exemplary embodiment, the selective growth of multiple layers of graphene (i.e., multilevel or multilayer), herein referred to as graphene 30, is illustrated. In this embodiment, the multiple layers of graphene are grown, using chemical vapor deposition (CVD), from both solid and liquid carbon sources, and at a temperature between 300° C.-400° C. Multilayer graphene 30 connects to VIA 16, using liner layer 28, creating an electrical connection that can carry current along each horizontal layer of graphene. In other embodiments current may travel from one graphene layer into another. However, there is generally higher electrical resistance between individual graphene layers. In yet other embodiments, the temperature at which the graphene is grown, using different catalysts than those referenced in this disclosure, can be above and/or below the range of 300° C.-400° C.

Referring now to FIG. 6, in accordance with an exemplary embodiment, another layer of etch stop material (25) is added followed by another substrate layer (32). A trench is etched through substrate layer 32 and etch stop material 25. The trench is etched such that the trench intersects the left end of the graphene 30 and does not penetrate through, but is in contact with, liner layer 28 (TaN/Ru layer). The trench is then lined with barrier metal 38, filled with a copper core, thereby creating VIA 36, and capped with etch stop (or etching retardant) layer 44. Thus, component 20 is connected to two VIAs with a graphene connector forming an electrical connection therebetween.

In general, the process of creating VIAs and graphene structures can be continued until the routing or desired connections are formed. In other embodiments, the exact process by which VIAs and graphene layers are created can vary. For example, a VIA can include a number of various core and/or barrier metals, and number of metals can be used as a catalyst for the growth of graphene (e.g., palladium).

Referring now to FIG. 7, an alternative exemplary embodiment is shown. In the alternative embodiment, a VIA opening is formed through substrate layer 32 and etch stop material 34 and is aligned such that it intersects a portion of liner layer 28. As shown in FIG. 7, the VIA opening does not go to the bottom of the graphene 30 trench, but preferably contacts the top of the graphene 30 trench. The via opening is then lined with barrier metal 36, filled with a core comprising copper 38, thereby creating VIA 36. The structure is capped with etch stop (or etching retardant) layer 44. In this embodiment, the bottom end of VIA 36 is in electrical contact with liner layer 28 (which provides a vertical electrical pathway) on a sidewall of the graphene 30 connector and the topmost layer of the graphene 30 connector. Thus, component 20 is connected to two VIAs with a graphene connector forming an electrical connection therebetween.

Embodiments of the present invention may be used in a variety of electronic applications, including but not limited to advanced sensors, memory/data storage, semiconductors, microprocessors and other applications.

A resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating graphene and metal interconnect structures (which are intended to be illustrative and not limiting), it is noted that modifications and variations may be made by persons skilled in the art in light of the above teachings.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

Each respective figure, in addition to illustrating the structure of the present invention at various stages, also illustrates the respective steps of the method for the fabrication/manufacture of graphene and metal interconnect structures.

What is claimed is:

1. An interconnect structure comprising:
   a graphene connector;
   a liner layer which lines a trench containing the graphene connector;
   an upper via, a lower end of the upper via being connected to a first end of the graphene connector, wherein the lower end of the upper via penetrates, at least in part, an opening through at least one horizontal layer of graphene of the graphene connector; and
   a lower via, a top end of the lower via being connected to a second end of a graphene connector, wherein a portion of both the liner layer and the second end of the graphene connector horizontally penetrate the lower via.

2. The interconnect structure of claim 1, wherein the upper via penetrates the graphene connector such that the upper via is substantially vertical in relation to the at least one horizontal layer of graphene, and wherein the lower via is substantially vertical in relation to the at least one horizontal layer of graphene.

3. The interconnect structure of claim 2, wherein the upper via contacts a liner layer at a bottom of the graphene connector.

4. The interconnect structure of claim 1, wherein the upper via contacts a liner layer at a sidewall of the graphene connector.

5. The interconnect structure of claim 1, wherein the liner layer includes at least one of Ru or Ta.

6. The interconnect structure of claim 1, wherein the graphene connector and a portion of the top end of the lower via are coplanar.

7. The interconnect structure of claim 1, wherein one or both of the upper via and lower via include a fill metal that fills a respective interior portion of the upper via and lower via, the fill metal being elemental forms or alloys including one or more of copper, aluminum, silver, gold, calcium, platinum, tin, lithium, zinc, nickel, and tungsten.

8. A method of forming an interconnect structure, the method comprising:
   etching a first trench, thereby removing at least a portion of a top end of a first via, the first end of the first trench intersecting the top portion of the first via;
   forming a liner layer into the first trench;
   forming a layer of graphene catalyst into the first trench;
   growing multiple layers of graphene in the first trench;
   depositing a layer of dielectric material to form a cap over the first trench and first via;
   applying an insulating material on top of the cap; and
   forming an opening through the insulating material, cap and a portion of the second end of the graphene filled first trench, such that the opening penetrates through at least one horizontal layer of graphene included in the graphene filled first trench from a substantially perpendicular direction relative to the at least one horizontal layer of graphene that is penetrated.

9. The method of claim 8 further comprising:
   depositing a layer of bather material into the opening; and
   filling the opening with fill metal to form a second via.

10. The method of claim 9, wherein the barrier material includes one or more of cobalt, ruthenium, tantalum, tantalum nitride, indium oxide, tungsten nitride, and titanium nitride.

11. The method of claim 9, wherein the fill metal being elemental forms or alloys including one or more of copper, aluminum, silver, gold, calcium, platinum, tin, lithium, zinc, nickel, and tungsten.

12. The method of claim 8, wherein growing multiple layers of graphene comprises chemical vapor deposition of a carbon source.

13. The method of claim 12 wherein the carbon source is liquid.

14. The method of claim 12, wherein the carbon source is a solid.

15. The method of claim 12 wherein the deposition temperature is from about 300° C.-400° C.

16. The method of claim 8, wherein the graphene catalyst comprising an elemental form or alloy including one or more of nickel, palladium, ruthenium, iridium and copper.

17. The method of claim 8 further comprising:
   applying an insulator material on top of the cap; and
   forming an opening through the insulating material and cap to expose a top surface of the graphene connector.

18. The method of claim 17 further comprising:
   depositing a layer of bather material into the opening; and
   filling the opening with fill metal to form a second via.

* * * * *